(12) United States Patent
Kesselring et al.

(10) Patent No.: US 8,547,154 B2
(45) Date of Patent: Oct. 1, 2013

(54) PROGRAMMABLE DUTY CYCLE SELECTION USING INCREMENTAL PULSE WIDTHS

(75) Inventors: Grant P. Kesselring, Milton, VT (US); Pradeep Thiagarajan, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 225 days.

(21) Appl. No.: 13/166,126

(22) Filed: Jun. 22, 2011

(65) Prior Publication Data

US 2012/0326760 A1    Dec. 27, 2012

(51) Int. Cl.
    *H03K 3/017*      (2006.01)

(52) U.S. Cl.
    USPC .......................................... 327/175; 327/172

(58) Field of Classification Search
    None
    See application file for complete search history.

(56) References Cited

U.S. PATENT DOCUMENTS

| | | | |
|---|---|---|---|
| 5,095,264 A | 3/1992 | Hulsing, II | |
| 5,127,036 A | 6/1992 | Pham | |
| 5,410,683 A | 4/1995 | Al-Khairi | |
| 5,451,893 A * | 9/1995 | Anderson | ...................... 327/174 |
| 5,757,218 A | 5/1998 | Blum | |
| 6,040,726 A | 3/2000 | Martin | |
| 6,426,660 B1 | 7/2002 | Ho et al. | |
| 6,518,809 B1 | 2/2003 | Kotra | |
| 6,603,337 B2 | 8/2003 | Cho | |
| 6,603,339 B2 * | 8/2003 | Atallah et al. | ................. 327/175 |
| 6,788,120 B1 | 9/2004 | Nguyen | |
| 6,882,196 B2 | 4/2005 | Yee et al. | |
| 6,906,571 B1 | 6/2005 | Nguyen | |
| 6,924,684 B1 | 8/2005 | Nguyen | |
| 6,981,185 B1 | 12/2005 | Davis et al. | |
| 6,992,516 B2 | 1/2006 | Yeh | |
| 7,005,900 B1 | 2/2006 | Nguyen | |
| 7,015,832 B2 | 3/2006 | Madni et al. | |
| 7,019,574 B2 | 3/2006 | Schrodinger | |
| 7,199,634 B2 | 4/2007 | Cho et al. | |
| 7,227,920 B2 | 6/2007 | Heikkila | |
| 2010/0225369 A1 * | 9/2010 | Badaroglu | ..................... 327/158 |

* cited by examiner

*Primary Examiner* — Cassandra Cox
(74) *Attorney, Agent, or Firm* — Gibb & Riley, LLC; David A. Cain, Esq.

(57) ABSTRACT

A method and device for generating a waveform according to programmable duty cycle control bits from a divided frequency reference signal. The device may include: a timing circuit that inputs a CLOCK signal having a 50% duty cycle to a divider, whose output varies over a plurality of divide-by-n settings; and a waveform generator. The waveform generator may, after a last low clock pulse is counted for a current evaluative cycle and before a beginning of a next evaluative cycle, shift a prior duty cycle waveform by ½ of a CLOCK cycle, to provide an incremented duty cycle for the waveform. Alternatively, the waveform generator may increment a gating signal from an adder, which determines an onset of an inoperative or low portion of the programmed duty cycle.

12 Claims, 13 Drawing Sheets

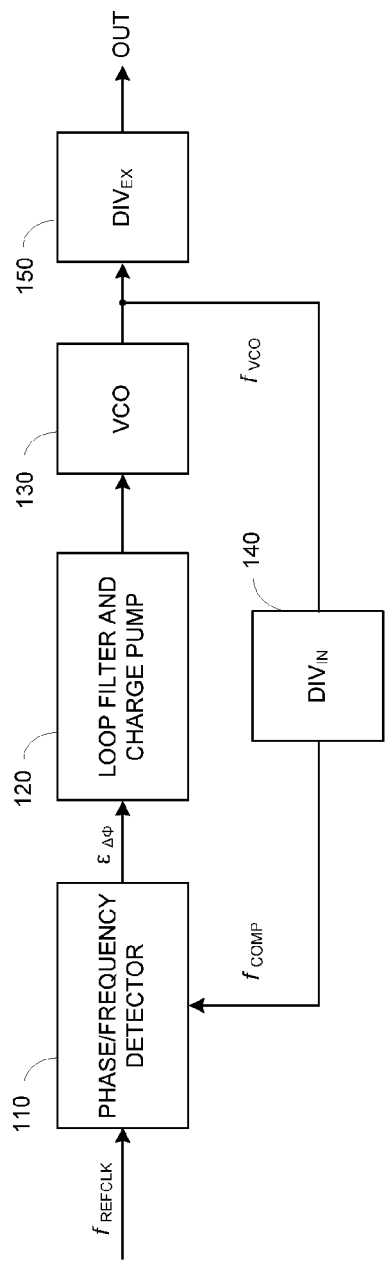
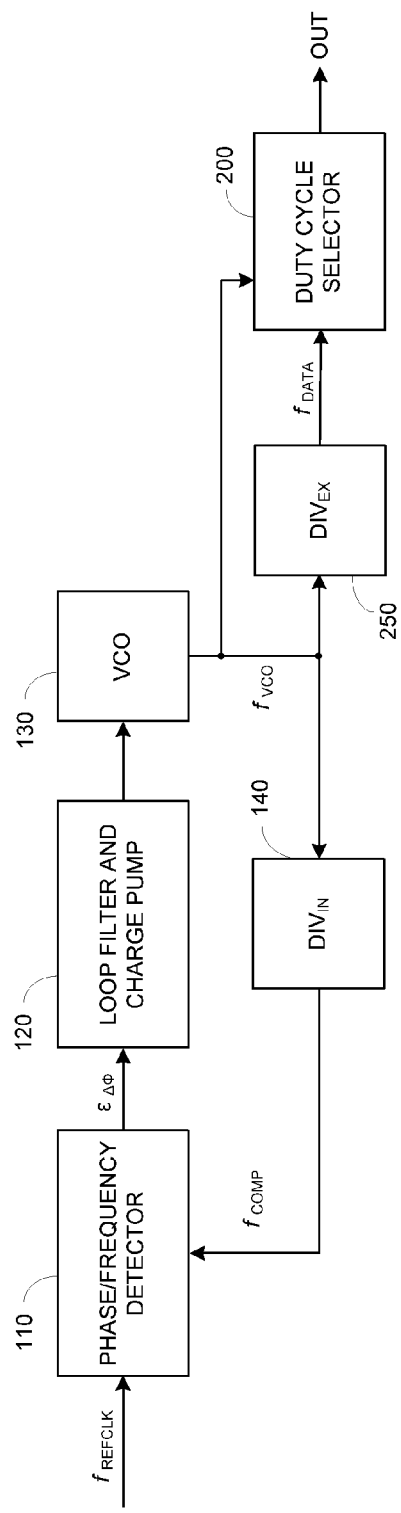

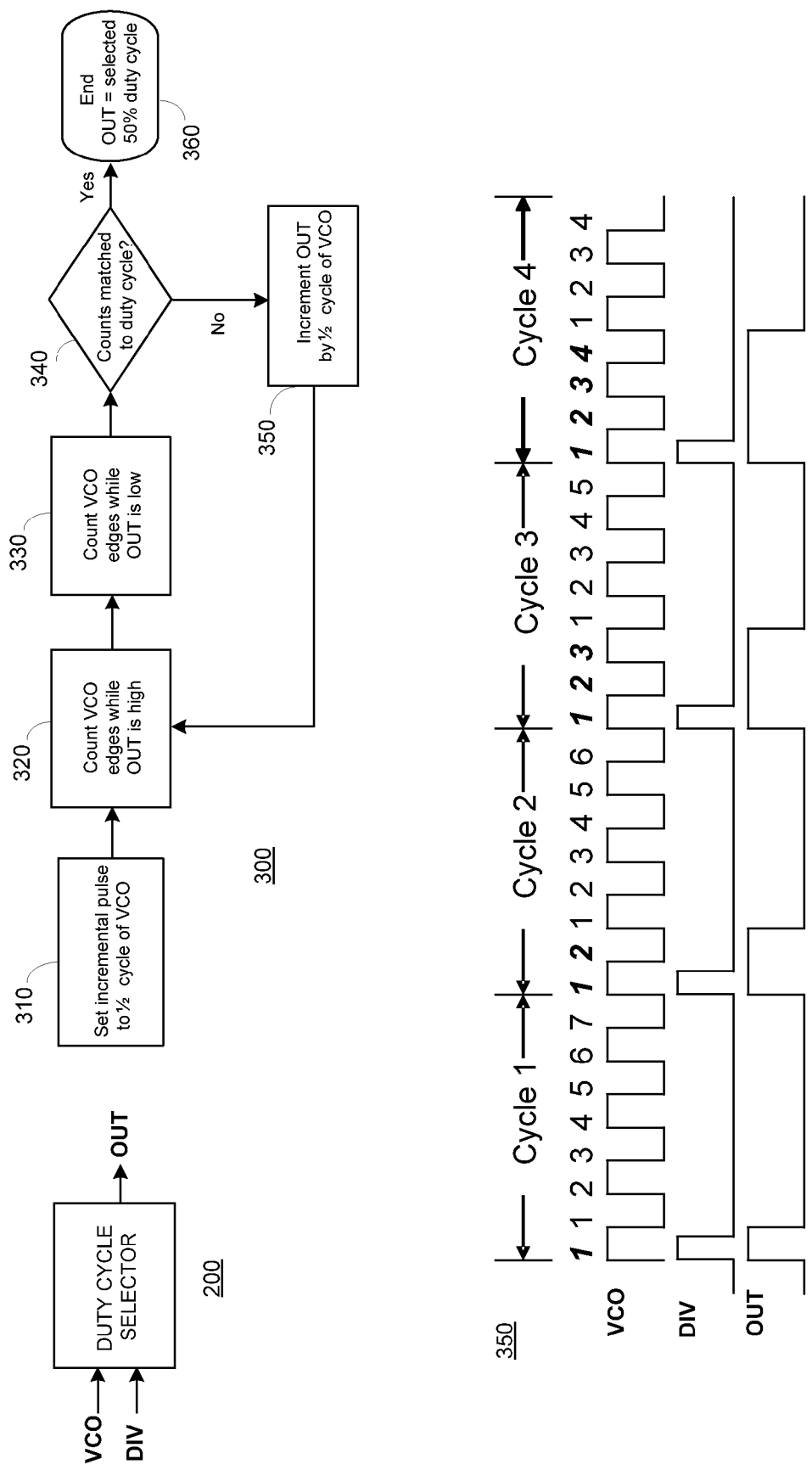

PROGRAMMABLE DUTY CYCLE SELECTION USING INCREMENTAL PULSE WIDTHS

BACKGROUND

1. Field of the Invention

An exemplary embodiment herein generally relates to a method and device that generates a waveform, having a selected programmable duty cycle, by iteratively incrementing a pulse width of an active portion of the waveform. In particular, a waveform generator of an exemplary embodiment herein may receive an input from a divide-by-n counter, which outputs a duty cycle that varies with the divide-by-n setting of the counter, and may output a selected programmable duty cycle waveform across all possible divide-by-n settings of the counter, without requiring a separate duty cycle counter for each possible divide-by-n setting.

2. Description of Related Art

Many electronic circuits include various logic circuits, e.g., processors, which operate at very high frequencies. Clocks for these logic circuits may be provided by multiplier circuits using phase-locked loops (PLLs) that increase a lower frequency output, e.g., 50 or 100 MHz, to a higher operating frequency for the logic circuit.

Referring to FIG. 1, a phase-locked loop (PLL) can include a phase/frequency detector 110, a loop low-pass filter and charge pump 120, and a voltage-controlled oscillator (VCO) 130. The phase/frequency detector 110 compares two input frequencies and generates an output that is a measure of their phase/frequency difference. If the first input frequency, $f_{REFCLK}$, does not equal the second input frequency from a negative feedback loop, the phase/frequency detector 110 produces a phase-error signal, $\epsilon_{\Delta\phi}$. Operating on the phase-error signal, a low-pass filter and charge pump 120 provide a voltage control signal, which is applied to the VCO 130. In response to the voltage control signal, the VCO output, $f_{VCO}$, changes such that the difference between $f_{REFCLK}$ and the second input frequency from the negative feedback loop is minimized. When $f_{VCO}$ is fed back to the phase/frequency detector 110, $f_{VCO}$ quickly "locks" onto the input frequency, $f_{REFCLK}$, maintaining a fixed phase/frequency relationship to the first input frequency.

A frequency multiplier circuit, using a PLL, is typically produced by adding one or more dividers 140, e.g., divide-by-n counters, into the feedback loop between the output of the VCO 130 and the second input, $f_{COMP}$, to the phase/frequency detector 110, as shown in FIG. 1. The frequency multiplier circuit produces a VCO output, $f_{VCO}$, which is a multiple, n, of the input frequency, $f_{REFCLK}$. Changing the value of the divide-by-n setting in any of the one or more dividers 140 will result in a commensurate change in the output frequency, $f_{VCO}$.

One type of divide-by-n counter is a linear feedback shift register (LFSR). The LFSR provides: programmable divide-by-n settings, where n is an integer; high speed; a small footprint; and low power consumption. The output of an LFSR divide-by-n counter has a duty cycle that varies with the value, n, of the divide-by-n counter. However, in the PLL feedback loop of a frequency multiplier circuit, the duty cycle of an LFSR divide-by-n counter is not of concern because the phase/frequency detector 110 is only triggered by either positive or negative edges of the LFSR divide-by-n counter.

Referring to FIG. 1, by further adding an external divider 150, which is external to the PLL feedback loop and the output of the VCO 130, the output frequency of the frequency multiplier circuit can be further varied to produce a timing signal, OUT, for use at various locations within a larger electronic circuit. In this case, if the external divider 150 were an LFSR divide-by-n counter, the external LFSR divide-by-n counter would also provide the benefits of programmable divide-by-n settings, high speed, small size and low power. However, many timing signals require not only a specific frequency, but also a specific duty cycle. As explained above, an LFSR divide-by-n counter cannot produce a single specific duty cycle over a range of divide-by-n settings. Therefore, an external LFSR divide-by-n counter 150, by itself, would be unsuitable when one seeks an output of a single specific duty cycle over a range of divide-by-n settings of the external LFSR divide-by-n counter 150.

The conventional solution to providing a single specific duty cycle for the output of external divider 150, whose duty cycle varies over a range of divide-by-n settings, is to couple the external divider 150 with a separate duty cycle counter, which generates the single specific duty cycle, for each of its divide-by-n settings. For example, assume a particular external LFSR divide-by-n counter outputs a 100 MHz signal, which does not have a 50% duty cycle, and that a 50% duty cycle is required for a 100 MHz timing signal. In this case, the 100 MHz output from the external LFSR divide-by-n counter is fed into a single separate duty cycle counter, which produces the required 50% duty cycle. The output of this single separate duty cycle counter, from among the n separate duty cycle counters that generate a 50% duty cycle for each of the divide-by-n settings of the external divider, is enabled by multiplexing. The remaining n−1 separate duty cycle counters that generate a 50% duty cycle are disabled. This solution works, but as the number of divide-by-n settings increases for the external divider 150, the footprint of the n separate duty cycle counters that generate a single specific duty cycle rapidly becomes prohibitive. Furthermore, this solution requires additional circuitry to deal with odd divide-by-n settings, i.e., odd divide-by-n settings must be shifted ½ of a divide-by-n cycle in order to generate a 50% duty cycle.

There remains a need for a method and device that generates a waveform, in which the device receives a varied duty cycle input from a divide-by-n counter, based on the divide-by-n setting of the counter, and which outputs a selected programmable duty cycle waveform across all possible divide-by-n settings of the counter, without requiring a separate duty cycle counter for each possible divide-by-n setting.

SUMMARY

In view of the foregoing, an exemplary embodiment herein disclosed herein provides a device for generating a waveform according to a programmable duty cycle from a frequency reference signal that may be divided. The device may include: a timing circuit that inputs a CLOCK signal having a 50% duty cycle to a divider, whose output varies over a plurality of divide-by-n settings; and a waveform generator. The waveform generator may include: a frequency doubler that outputs clock pluses that are double a frequency of the CLOCK signal; a ½ CLOCK pulse generator that produces one ½ of a CLOCK cycle from the output of the divider and an output of the doubler at the beginning of every evaluative cycle; high and low clock pulse counters that generate high and low clock pulses, which are double a frequency of the CLOCK signal during a current evaluative cycle, the high and low pulses being gated by high and low portions of a fed back output of the waveform generator, OUT, corresponding to a duty cycle for the current evaluative cycle; a bit comparator that compares high and low clock bit counts from the high and low clock pulses, and if the duty cycle for the current evaluative cycle is less than a bit value of the programmed duty cycle, then outputs an increment signal, INC, after a last low clock pulse is counted for the current evaluative cycle and before a beginning of a next evaluative cycle; a ½ CLOCK shifter that shifts a duty cycle of OUT from the current evaluative cycle by ½ of a CLOCK cycle, upon receiving the INC signal and before the beginning of the next evaluative cycle; and a pulse width accumulator that receives the one ½ of a CLOCK cycle and the shifted duty cycle of OUT for the current evaluative cycle, and forms a pulse width of a waveform of the duty cycle of OUT, which is incremented ½ of a CLOCK cycle relative to a beginning of the duty cycle of OUT for the current evaluative cycle, at the beginning of the next evaluative cycle.

Another exemplary embodiment herein disclosed herein provides a method of generating a waveform according to a programmable duty cycle from a frequency reference signal that is divided, in which the method includes: inputting a CLOCK signal having a 50% duty cycle to a divider, whose output varies over a plurality of divide-by-n settings; and generating a waveform corresponding to a duty cycle of an output, OUT. The generating of a waveform further including: receiving clock pulses that are double a frequency of the CLOCK signal; generating one ½ of a CLOCK cycle from the output of the divider and an output of the doubled CLOCK frequency at a beginning of an evaluative cycle initiated by an output pulse from the divider; generating high and low clock pulse counts from high and low clock pulses, which are double the frequency of the CLOCK signal during a current evaluative cycle, and gating the high and low clock pulses by high and low portions of a fed back output of the waveform generator, OUT, corresponding to a duty cycle for the current evaluative cycle; comparing high and low clock bit counts from the high and low clock pulses, and if the duty cycle for the current evaluative cycle is less than a bit value of the programmed duty cycle, then outputting an increment pulse width signal, INC, after a last low clock pulse is counted for the current evaluative cycle and before a beginning of a next evaluative cycle; shifting, by one ½ of a CLOCK cycle, a duty cycle of OUT from the current evaluative cycle, upon receiving the INC signal and before the beginning of the next evaluative cycle; and receiving, by a pulse width accumulator, the one ½ of a CLOCK cycle and the shifted duty cycle of OUT for the current evaluative cycle, and forming a pulse width of a waveform of the duty cycle of OUT, which is incremented ½ of a CLOCK cycle relative to a beginning of the duty cycle of OUT for the current evaluative cycle, at the beginning of the next evaluative cycle.

Yet another exemplary embodiment herein disclosed herein provides a device for generating a waveform according to a programmable duty cycle from a frequency reference signal that may be divided. The device including: a timing circuit that inputs a CLOCK signal having a 50% duty cycle to a divider, whose output varies over a plurality of divide-by-n settings; and a waveform generator. The waveform generator further including: a positive edge detector that creates a pulse at every positive edge of the output from the divider, CLK1; a dual edge detector that creates a narrow pulse at each edge of CLOCK creating clock pulses at a frequency double that of CLOCK, that is, CLK2; a pulse width accumulator comprising a down counter and an up counter, the down counter being decremented with every positive edge of CLK1 and the down counter being incremented by every negative edge of CLK2, a width of said pulse width accumulator, that is, CLK_GATE, being fed back to gate CLK2 inputs to high and low clock pulse counters, according to a high portion and a low portion of said duty cycle of OUT for every evaluative cycle, and a bit comparator that compares bit values of the high and low clock pulse counters at a beginning of every evaluative cycle and generates an increment signal, INC, when the high and low clock pulse counters do not match high and low bit values of programmed duty cycle bits, while CLK1 is high, the INC signal being transmitted to the pulse width accumulator to increment CLK_GATE by one ½ of a CLOCK cycle for a next evaluative cycle, wherein at the beginning of every evaluative cycle, a defined sequence of processes takes place including, in sequential order, a comparison of bit values for the high and low clock pulse counters to the programmed duty cycle control bits; pulsing the INC signal, if the bit values for the high and low clock pulse counters do not match the programmed duty cycle control bits; incrementing, by the pulse width accumulator, CLK_GATE by one ½ of a CLOCK cycle, upon receiving the INC signal; and resetting the high and low clock pulse counters, subsequent to the incrementing, for a next evaluative cycle; and a set-rest (S/R) latch, wherein a positive edge of CLK1 is input to a set pin of the S/R latch, and a detection pulse, generated by detection of a bit value corresponding to onset of a low portion of said programmable duty cycle, is input to a reset pin of said S/R latch, to provide an output of said programmable duty cycle.

BRIEF DESCRIPTION OF THE SEVERAL VIEWS OF THE DRAWINGS

The exemplary embodiments herein will be better understood from the following detailed description with reference to the drawings, which are not necessarily drawing to scale and in which:

FIG. 1 illustrates a block diagram of a multiplier circuit, including a phase-locked loop (PLL), that is connected to an external divider in the prior art;

FIG. 2 illustrates a block diagram of a duty cycle selector 200 that includes two timing circuit inputs: a frequency output, $f_{VCO}$, with a 50% duty; and an output from a divide-by-n counter 250; and a single output that generates a waveform of a selected programmed duty cycle for all possible divide-by-n settings of the divide-by-n counter 250 in an exemplary embodiment herein;

FIG. 3 illustrates a flowchart 300 of general method of providing a selected duty cycle waveform by iteratively incrementing pulse widths of the output waveform from the duty cycle selector 200, and an associated timing diagram 350 in an exemplary embodiment herein;

DETAILED DESCRIPTION

Figure 4:
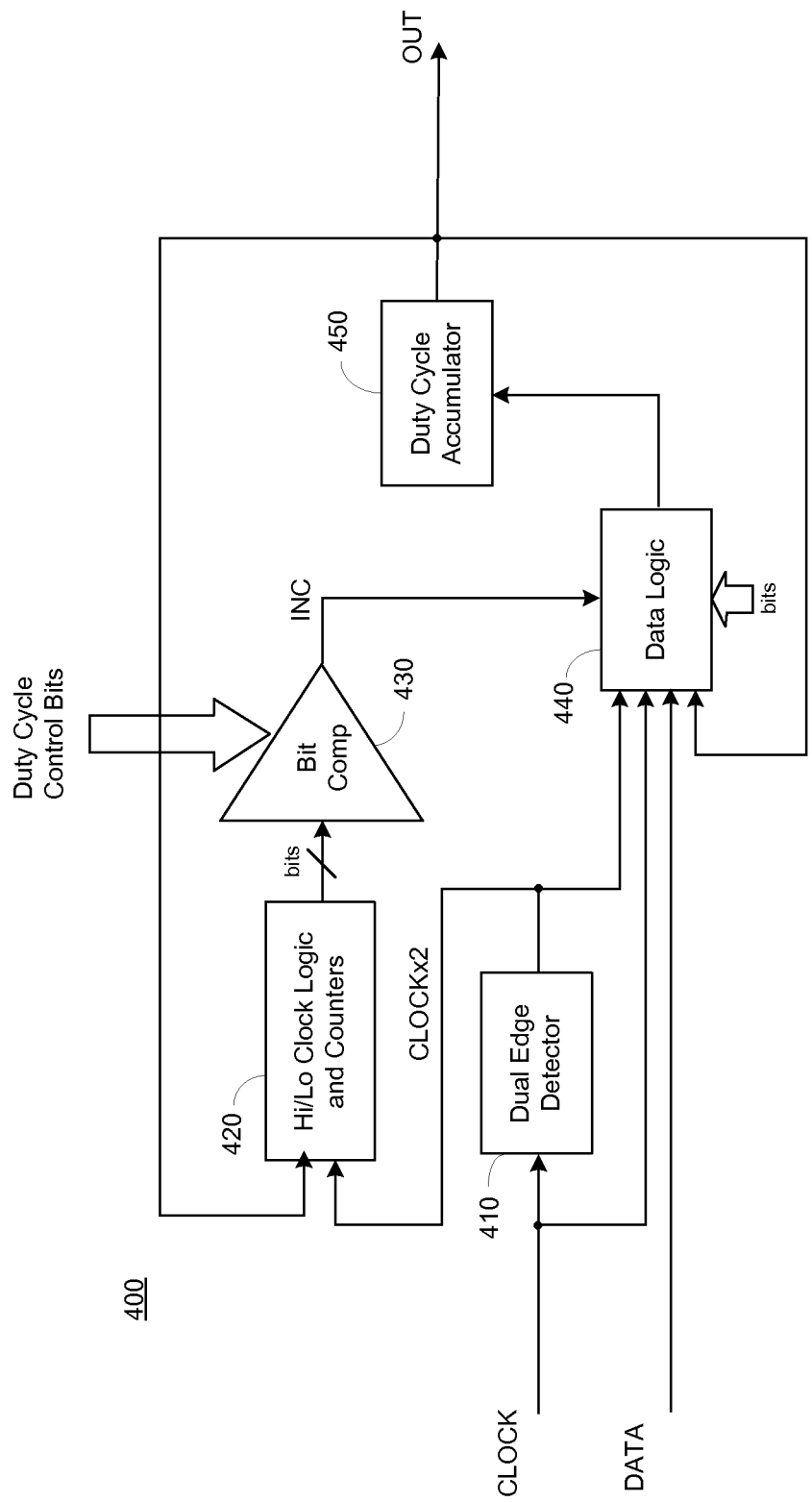
FIG. 4 illustrates a functional block diagram 400 that may implement the general method of duty cycle selection shown by the flowchart 300 of FIG. 3 in an exemplary embodiment herein.

The exemplary embodiments herein and the various features and advantageous details thereof are explained more fully with reference to the non-limiting exemplary embodiments that are illustrated in the accompanying drawings and detailed in the following description. It should be noted that the features illustrated in the drawings are not necessarily drawn to scale. Descriptions of well-known materials, components, and processing techniques are omitted so as to not unnecessarily obscure the exemplary embodiments herein. The examples used herein are intended to merely facilitate an understanding of ways in which the exemplary embodiments herein may be practiced and to further enable those of skill in the art to practice the exemplary embodiments herein. Accordingly, the examples should not be construed as limiting the scope of the exemplary embodiments herein.

As described above, there remains a need for a method and device that generates a waveform, in which the device receives a varied duty cycle input from a divide-by-n counter, based on the divide-by-n setting of the counter, and which outputs a selected programmable duty cycle waveform across all possible divide-by-n settings of the counter, without requiring a separate duty cycle counter for each possible divide-by-n setting.

Referring to FIG. 2, a block diagram illustrates a duty cycle selector 200 that generates a waveform in an exemplary embodiment herein, which includes two timing circuit inputs: a frequency output, $f_{VCO}$, with a 50% duty cycle from, for example, a VCO 130 of a PLL; and an output from a divide-by-n counter 250 that receives $f_{VCO}$ as an input and whose duty cycle varies with its divide-by-n setting; and a single output that generates a waveform of a selected programmed duty cycle for all possible divide-by-n settings of the divide-by-n counter 250. The duty cycle selector 200 of an exemplary embodiment herein may include the following features: a programmable duty cycle; and automatic adjustment of the generated waveform to the programmed duty cycle, when either the divide-by-n setting of the divide-by-n counter 250 or the input frequency, $f_{VCO}$, changes.

Referring to FIG. 2, VCO 130 of a frequency multiplier circuit, which uses a PLL with one or more internal linear feedback shift registers (LFSRs) as divide-by-n counters, may provide the input to the divide-by-n counter 250. The divide-by-n counter 250 may also use an LFSR as a divide-by-n counter in an exemplary embodiment herein, and thereby, gain the features of programmability, small size, high speed and low power, when compared to other counter types.

Referring to FIG. 3, flowchart 300 illustrates a general method of providing a selected duty cycle waveform by iteratively incrementing pulse widths of the output waveform from the duty cycle selector 200, while timing diagram 350 illustrates the inputs and outputs to the duty cycle selector 200 that are associated with the general method of duty cycle selection of an exemplary embodiment herein.

To illustrate this general exemplary embodiment, assume that the output waveform of the duty cycle selector 200, which is shown as OUT in the timing diagram 350, is programmed for a 50% duty cycle. The duty cycle selector 200 may, for example, receive a first input, as indicated by VCO of the timing diagram, from an output of a VCO 130 of a frequency multiplier circuit, and a second input, as indicated by DIV of the timing diagram, from a divide-by-4 counter 250 that is triggered by a positive edge of VCO. In this example, the first input, VCO, may be characterized by a 50% duty cycle, while the second input, DIV, from the divide-by-4 counter may be characterized by a non-50% duty cycle.

Referring to timing diagram 350 for this general exemplary embodiment, each evaluative cycle, i.e., Cycles 1 through 4, of the duty cycle selector 200 may be triggered by a positive edge of DIV. With the assumed divide-by-4 counter, each evaluative cycle corresponds to four successive VCO square wave cycles, with each VCO square wave comprising a positive and a negative edge, each edge being followed by a period of ½ of a VCO square wave cycle. Thus, each evaluative cycle comprises eight VCO edges and eight×½ VCO square wave cycles. The output waveform of the duty cycle selector 200, OUT, may comprise a number of iteratively incremented pulse widths, each increment of the pulse width being equal to ½ of a VCO square wave cycle in an exemplary embodiment herein.

Referring to flow chart 300, upon triggering the first evaluative cycle with the positive edge of DIV, OUT may be set to one incremental pulse 310, i.e., ½ of a VCO square wave cycle, by the duty cycle selector 200 in an exemplary embodiment herein. Assume in this general exemplary embodiment, that each positive edge of OUT is regarded as high; while each negative edge of OUT is regarded as low. While OUT is high during the first evaluative cycle, the number of VCO edges, both positive and negative, may be counted 320, and while OUT is low during the first evaluative cycle, the number of VCO edges, both positive and negative, may also be counted 330. Referring to timing diagram 350, there may be a count of one (1) VCO edge, while OUT is high, and a count of seven (1-7) VCO edges, while OUT is low, at the end of the first evaluative cycle, Cycle 1. The number of VCO edges, while OUT is high, and the number of VCO edges, while OUT is low, may be compared to values of the programmed duty cycle control bits corresponding to the selected 50% duty cycle 340. If the counts do not match the values of the programmed duty cycle control bits, then OUT is incremented by ½ of a VCO square wave cycle 350 for the next evaluative cycle.

Upon the positive edge of the second DIV pulse triggering the second evaluative cycle, i.e., Cycle 2, OUT from Cycle 1 may be incremented by ½ of a VCO square wave cycle to provide two ½ VCO square wave cycles. Referring to timing diagram 350, there may be two (1 2) VCO edges, while OUT is high 320, and six VCO edges (1-6), while OUT is low 330, at the end of Cycle 2. Again, the number of VCO edges, while OUT is high, and the number of VCO edges, while OUT is low, do not match the values of the programmed duty cycle control bits corresponding to the selected 50% duty cycle 340, and OUT may be incremented by another ½ of a VCO square wave cycle 350 for the next evaluative cycle.

Upon the positive edge of the third DIV pulse triggering the third evaluative cycle, i.e., Cycle 3, OUT from Cycle 2 may be incremented by ½ of a VCO square wave cycle to provide three ½ VCO square wave cycles. Referring to timing diagram 350, there may be three (1 2 3) VCO edges, while OUT is high 320, and five VCO edges (1-5), while OUT is low 330, at the end of Cycle 3. Again, the number of VCO edges, while OUT is high, and the number of VCO edges, while OUT is low, do not match the values of the programmed duty cycle control bits corresponding to the selected 50% duty cycle 340, and OUT may be incremented by another ½ of a VCO square wave cycle 350 for the next evaluative cycle.

Upon the positive edge of the fourth DIV pulse triggering the fourth evaluative cycle, i.e., Cycle 4, OUT from Cycle 3 may be incremented by ½ of a VCO cycle to provide four ½ VCO square wave cycles. Referring to timing diagram 350, there may be four (1 2 3 4) VCO edges, while OUT is high 320, and four VCO edges (1-4), while OUT is low 330, at the end of Cycle 4. In this case, the number of VCO edges, while OUT is high, and the number of VCO edges, while OUT is low, match the values of the programmed duty cycle control bits corresponding to the selected 50% duty cycle 340, and further incrementing of the OUT pulse width may be stopped 360.

Referring to FIG. 4, a block diagram 400 illustrates functional blocks that may implement the general method of duty cycle selection shown by the flowchart 300 in FIG. 3 of an exemplary embodiment herein. The functional blocks may correspond to circuits that provide logic gates, signal inversions, timing signals, timing delays, and/or timing shifts, which ensure proper operation of the general method of duty cycle selection.

A timing circuit may provide two inputs to the waveform generating circuit of an exemplary embodiment herein. The first input may be a CLOCK signal, having a 50% duty cycle generated by, for example, a VCO of a multiplier circuit using a PLL. Alternatively, another type of circuit may provide a frequency output with a 50% duty cycle for CLOCK. Referring to FIG. 4, CLOCK may be input to a dual edge detector 410 that detects both positive and negative edges of CLOCK. The dual edge detector 410 may output a CLOCK×2 signal that is double the frequency of CLOCK and that comprises narrow pulses corresponding to both positive and negative edges of CLOCK, which are separated by approximately ½ of a CLOCK cycle. The second input may be generated by a divide-by-n counter, which receives CLOCK as its input. The divide-by-n counter may, for example, comprise an LFSR divide-by-n counter that outputs a signal, DATA, whose duty cycle varies with the divide-by-n setting of the counter.

Programmed duty cycle control bits may be input to a bit comparator 430 to control iterative increments to the output, i.e., OUT, of an exemplary embodiment herein. The programmed duty cycle control bits may comprise bit values corresponding to an operative or high portion of an output waveform and to a low portion of the output waveform, where a ratio of the high to the high and low portions of the output waveform define the programmed duty cycle.

At the beginning of an evaluative cycle, which is triggered by a positive edge of DATA, high and low clock counters of functional block 420 may be reset. CLK×2 pulses may arrive at the high and low clock logic circuits of functional block 420, where they are gated into the high and low clock counters, respectively, based on their arrival during either the high portion or low portion of an OUT waveform, which is fed back to the high and low clock logic circuits of functional block 420. The bit counts of the high and low clock counters may then be input to bit comparator 430, after the last low clock pulse of the current evaluative cycle, to allow a determination of whether the bit counts correspond to the programmed duty cycle control bits for the current evaluative cycle.

At the beginning of the next evaluative cycle and concomitant with a reset, the result of the bit comparisons from the prior just-completed evaluative cycle may be switched from the output of bit comparator 430 to data logic block 440 for the next evaluative cycle. If the bit counts from the prior just-completed evaluative cycle do not correspond to the bit values of the programmed duty cycle control bits, then the duty cycle of the prior just-completed evaluative cycle has not yet been incremented to a value equal to that provided by the programmed duty cycle control bits. In this case, an increment duty cycle signal, INC, may be switched from bit comparator 430 to data logic block 440 at the beginning of the next evaluative cycle. Alternatively, if the bit counts from the prior just-completed evaluative cycle equal the bit values of the programmed duty cycle control bits, then the result of the bit comparisons indicates that the duty cycle of the prior just-completed evaluative should not be incremented for the next evaluative cycle.

With inputs from CLOCK and DATA, data logic block 440 may form a single ½ of a CLOCK cycle signal at the beginning of each evaluative cycle by, for example, inputting the positive edge of DATA and the first negative edge of CLOCK into set and reset inputs, respectively, of a set-reset flip-flop. Alternatively, a single ½ of a CLOCK cycle signal may be provided by triggering a one shot, which is trimmed to the period of ½ of a CLOCK cycle for a fixed CLOCK frequency, with the positive edge of DATA. At the beginning of a next evaluative cycle, the data logic block 440 may replicate the duty cycle of a prior evaluative cycle, based on inputs from CLOCK and DATA, which provide a bit value corresponding to a full period between successive DATA inputs, and from OUT of the prior just-completed evaluative cycle.

At the beginning of the next evaluative cycle and concomitant with a reset, data logic block 440 may receive the increment duty cycle signal, INC, based on the result of the bit comparisons of the high and low clock bit counts not matching the programmed duty cycle control bits. At the beginning of the next evaluative cycle, the data logic block 440 may replicate an outputted waveform that corresponds to the duty cycle of OUT for the prior just-completed evaluative cycle. Upon receiving the INC signal, the single ½ of a CLOCK cycle signal and the replicated waveform may be transmitted from the data logic block 440 to the duty cycle accumulator 450, in such a manner that the duty cycle accumulator 450 provides an output, OUT, at the beginning of the next evaluative cycle that has incremented the duty cycle of OUT, relative to the prior duty cycle of OUT, by ½ of a CLOCK cycle.

Alternatively, when no INC signal is received at the beginning of the next evaluative cycle, the data logic circuit 440 may transmit the single ½ of a CLOCK cycle signal and the replicated waveform to the duty cycle accumulator 450, in such a manner as to prevent further incrementing of the duty cycle of OUT, relative to the prior duty cycle of OUT, at the beginnings of successive evaluative cycles.

Figure 5:
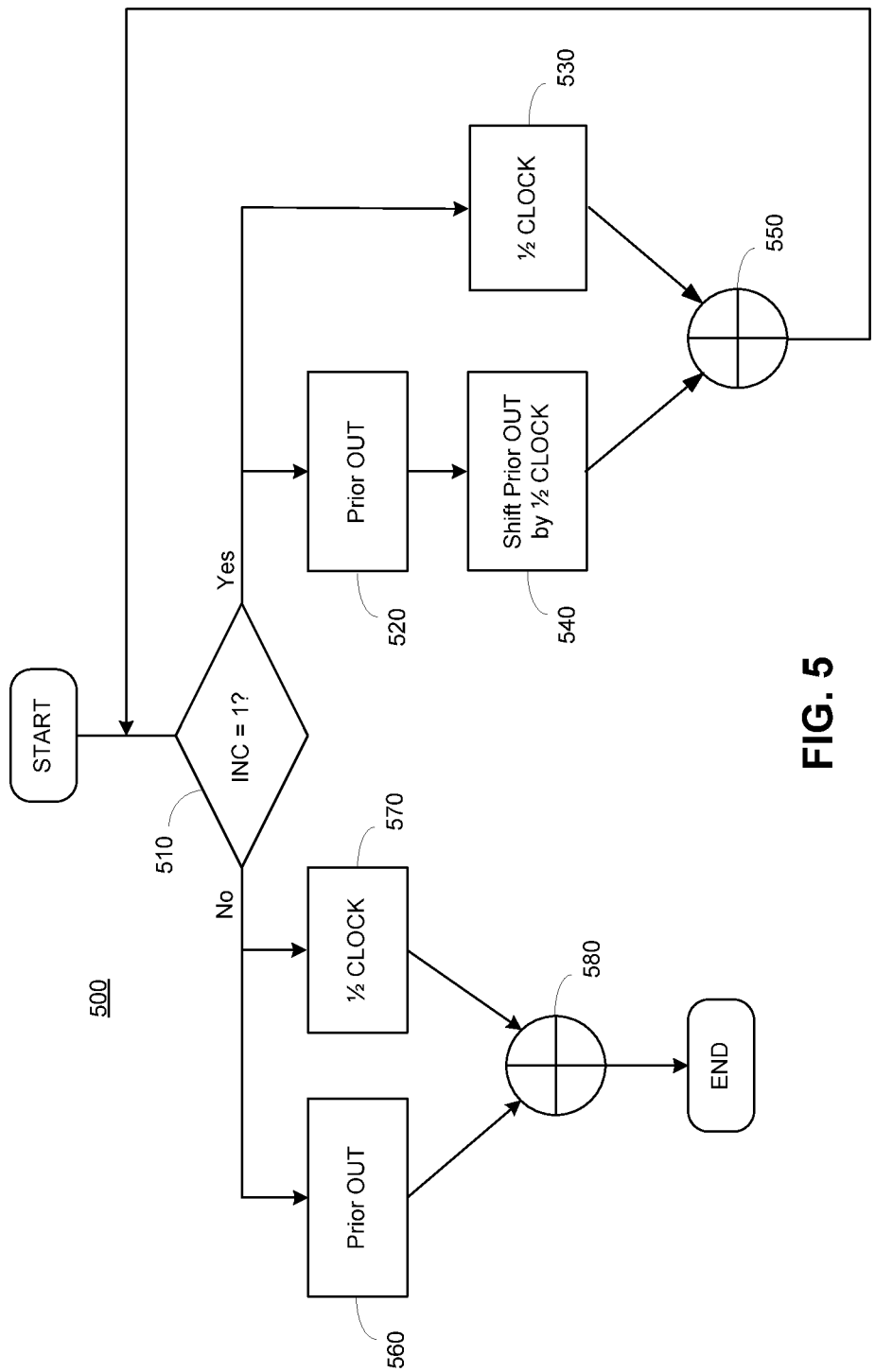
FIG. 5 illustrates a flowchart of a method of shifting a waveform, equivalent to a prior just-completed evaluative cycle, by ½ of a CLOCK cycle, and logically ORing this shifted waveform with a single ½ of a CLOCK cycle, generated at the beginning of an evaluative cycle, until the programmed duty cycle may be attained in an exemplary embodiment herein.
Figure 6:
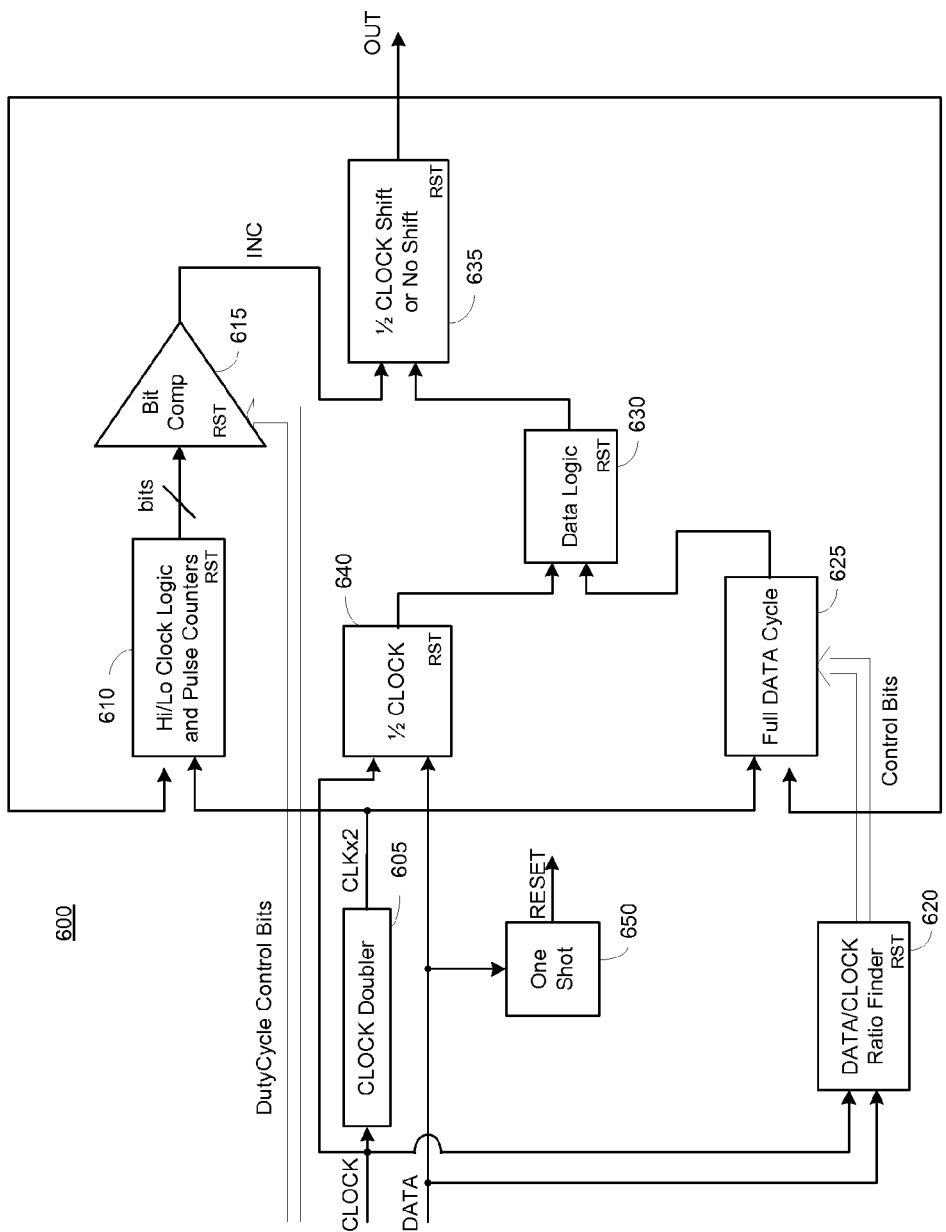
FIG. 6 illustrates a functional block diagram 600 of a top level of a first circuit that uses the method of shifting a waveform, illustrated by FIG. 5, in an exemplary embodiment herein.
Figure 7:
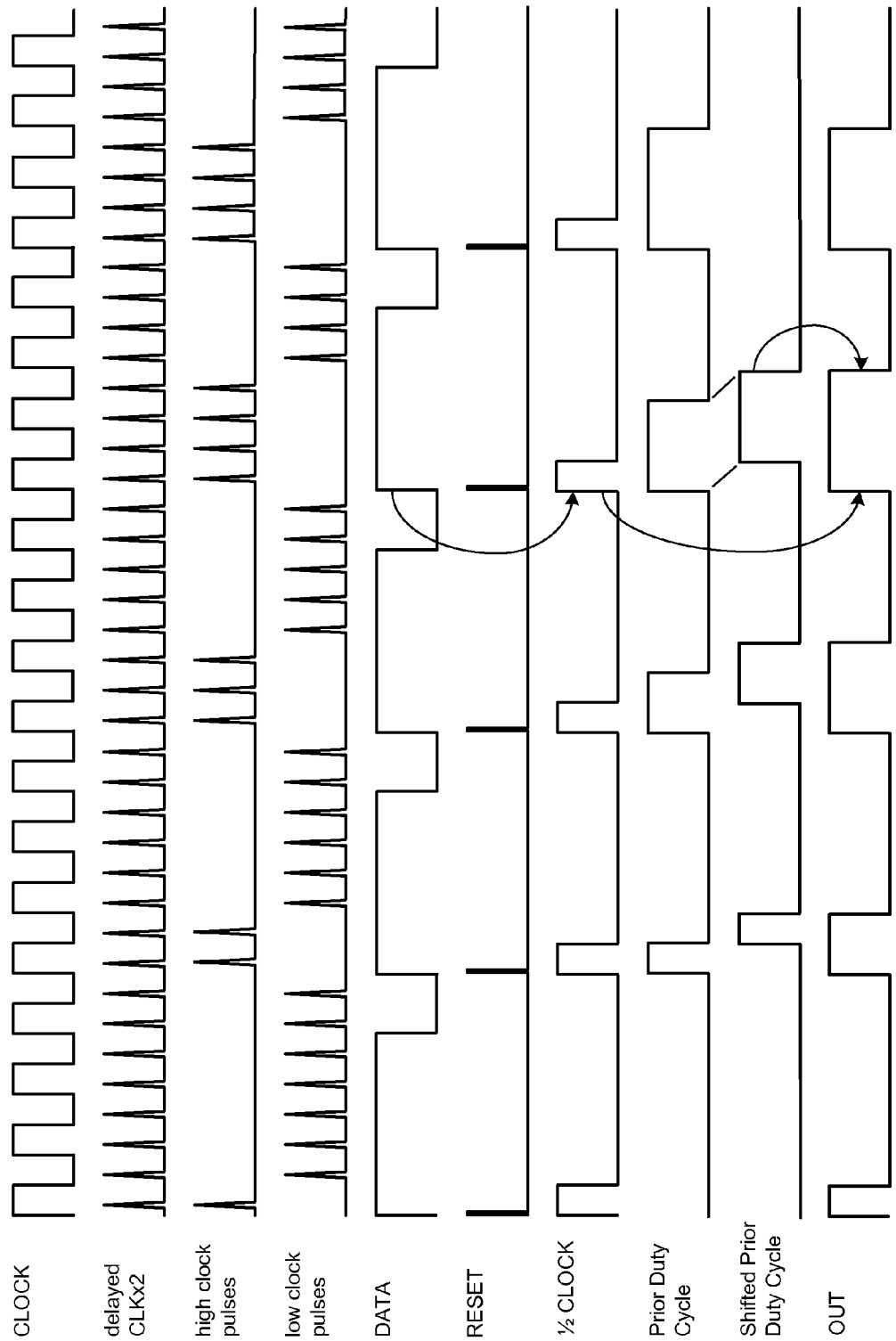
FIG. 7 illustrates a timing diagram 700, based on traces from a computer simulation of the first circuit, corresponding to the inputs and outputs of the functional blocks in FIG. 6, in an exemplary embodiment herein.

One exemplary embodiment of a method herein is illustrated by FIG. 5, in which flowchart 500 illustrates a method of shifting a waveform, equivalent to OUT of a prior just-completed evaluative cycle, by ½ of a CLOCK cycle, and logically ORing this shifted waveform with a single ½ of a CLOCK cycle, generated at the beginning of an evaluative cycle, until the programmed duty cycle is attained. FIG. 6 illustrates a functional block diagram 600 of a top level of a first circuit that uses the method of FIG. 5, and FIG. 7 illustrates a timing diagram 700, based on traces from a computer simulation of the first circuit, corresponding to the inputs and outputs of the functional blocks in FIG. 6.

Referring to FIG. 5, an exemplary method herein illustrates that an evaluative cycle may provide either: an increment duty cycle signal, INC, corresponding to a logical 1, which indicates that the duty cycle of the evaluative cycle is less than the bit values of the programmed duty cycle control bits, or a logical 0, indicating that the duty cycle of the evaluative cycle is equal to the bit values of the programmed duty cycle control bits 510. If an INC signal is present at the beginning of the next evaluative cycle, a waveform corresponding to the prior OUT waveform 520 and a ½ CLOCK cycle 530, generated at the beginning of the next evaluative cycle, may be accessed, and the prior OUT waveform may be shifted by ½ of a CLOCK cycle 540 relative to the beginning of the next evaluative cycle. The shifted prior OUT waveform may then be logically ORed with the ½ CLOCK cycle 550 to form an incremented duty cycle for the next evaluative cycle.

Alternatively, if an INC signal is not present at the beginning of the next evaluative cycle, i.e., INC=0, a waveform signal corresponding to the prior OUT waveform 560 and a ½ CLOCK cycle 570, generated at the beginning of the next evaluative cycle, may be accessed. However, in this case, the prior OUT waveform is not shifted by ½ of a CLOCK cycle. Therefore, when the prior OUT waveform and the ½ CLOCK cycle are logically ORed 580, the duty cycle for the next evaluative cycle is not incremented, because the both the prior OUT waveform and the ½ of a CLOCK cycle begin at the same time and thus, overlap.

Referring to the functional block diagram 600 of FIG. 6, a CLOCK signal comprising a 50% duty cycle may be input to a CLOCK Doubler 605 of an exemplary embodiment herein. The CLOCK Doubler 605 may detect both positive and negative edges of CLOCK and may generate clock pulses with, for example, one-shots, to produce an output, CLK×2, which is double the frequency of CLOCK and which has clock pulse widths determined by the one-shots.

Figure 8:
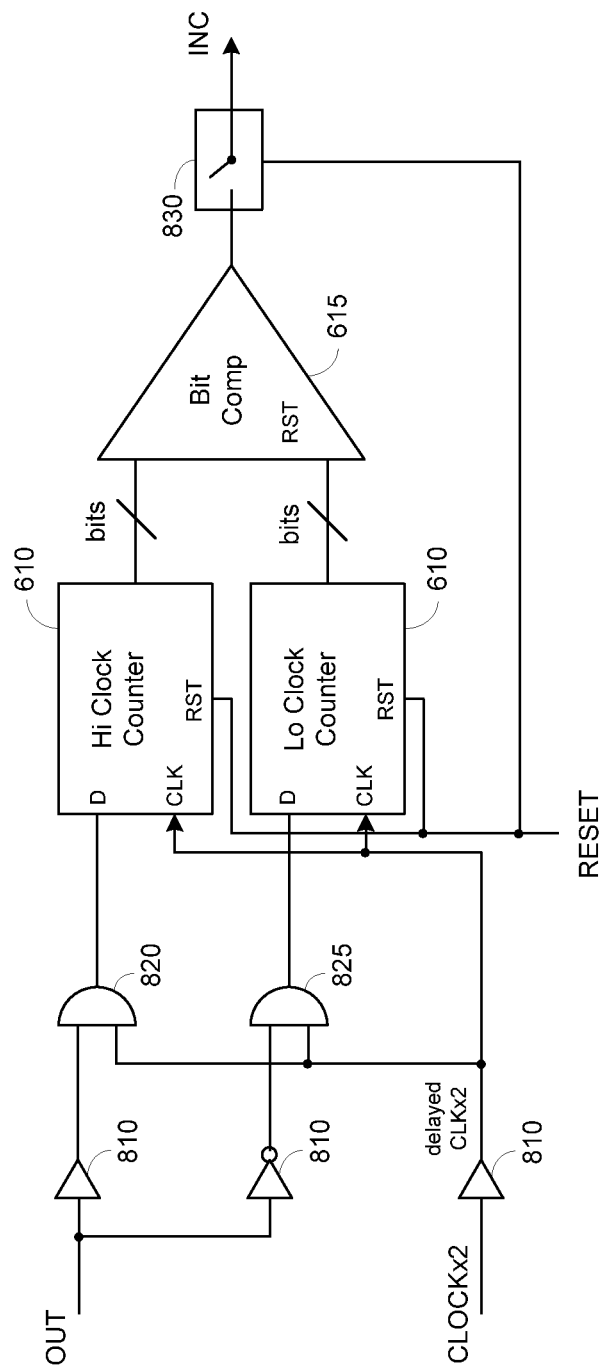
FIG. 8 illustrates a schematic of a portion of the functional block diagram 600 that comprises delay elements, gating circuits, counting circuits, bit comparisons, and switching in an exemplary embodiment herein.

At the beginning of each evaluative cycle, both high and low clock pulse counters of functional block 610 may be reset by, for example, a sharp RESET signal, as shown in FIG. 7, derived from, for example, a one-shot 650 triggered by each positive edge of DATA. To ensure that the RESET signal does not occur simultaneously with the counting of a first CLK×2 clock pulse in an evaluative cycle, the CLK×2 and OUT inputs to the high and low clock logic circuits and pulse counters of functional block 610 may be delayed by delay elements 810, as shown in FIG. 8, to provide matched delayed CLK×2 and OUT signals. The matched delay elements 810, for example, inverters, may provide a delay, s, greater than that of the pulse width of the RESET signal.

Delayed CLK×2 clock pulses and a delayed high portion of OUT may be logically ANDed by gate 820 of FIG. 8 to provide high clock pulses to the high clock counter of functional block 610; while delayed CLK×2 clock pulses and an inverted delayed low portion of OUT may be logically ANDed by gate 825 of FIG. 8 to provide low clock pulses to the low clock counter of functional block 610. Both high and low clock counters of functional block 610 may count at least 2n−1 pulses, where n equals the maximum divide-by-n setting of the divide-by-n counter used to generate the second input signal, DATA. The bit values stored by the high and low clock counters of functional block 610 may be represented by q bits, where q is greater than or equal to $\log_2 (2n-1)$.

Referring to FIG. 7, following RESET, when a high clock pulse from the high clock logic circuit arrives at the high clock pulse counter, the high clock pulse counter starts counting. After the duty cycle of OUT, which is fed back to the high and low clock logic circuits and pulse counters of functional block 610, for the now current evaluative cycle goes low, there are no high clock pulses and the high clock pulse counter holds the value of its last bit count. When the duty cycle of OUT goes low, low clock pulses from the low clock logic circuit arrive at the low clock pulse counter and the low clock pulse counter starts counting. The low clock pulse counter stores the count after the last low clock pulse.

At the beginning of the next evaluative cycle, the bit values of the high and low clock pulse counters may be compared on a bit-by-bit basis in bit comparator 615 by, for example, XNOR or NAND logic circuits, to determine whether the duty cycle of the just-completed evaluative cycle matches the bit values of the programmed duty cycle control bits of an exemplary embodiment herein. Correct bit values may only be obtained after the last low clock pulse of the just-completed evaluative cycle and before counting for the next evaluative cycle begins. Hence, the delay, s, applied to the CLK×2 clock pulses and the duty cycle of OUT by the delay elements 810 of the high and low clock logic circuits of 610, should not exceed the sum of the pulse width of RESET and of the propagation delay through bit comparator 615, to ensure that the last low clock pulse is counted.

At the arrival of the RESET signal, the last clock pulse of the just-completed evaluative cycle has been counted and the first delayed clock pulse of the next evaluative cycle has yet to be counted, so while the RESET signal resets the high and low clock pulse counters for the next evaluative cycle, it also outputs the results of the bit-by-bit comparisons of the high and low clock pulse counts from bit comparator 615 for the just-completed evaluative cycle via switch 830 of FIG. 8. When the results of the bit-by-bit comparisons do not match the bit values of the programmed duty cycle control bits, switch 830 outputs a high, i.e., a logical 1, indicating that the duty cycle of OUT for the just completed evaluative cycle does not yet match the bit values of the programmed duty cycle control bits and hence, the duty cycle of OUT must be incremented. Alternatively, the results of the bit-by-bit comparisons match the bit values of the programmed duty cycle control bits and switch 830 outputs a low, i.e., a logical 0, indicating that no further increments to the duty cycle of OUT for the just completed evaluative cycle are needed.

In an exemplary embodiment herein, the bit values of the programmed duty cycle control bits input to bit comparator 615 may correspond to an active portion, i.e., high or logical 1, and an inactive portion, i.e., low or logical 0, of the programmed duty cycle as expressed in increments of ½ CLOCK cycles. The total number of ½ CLOCK cycles for each period between successive DATA input signals may automatically be determined from functional block 620, which determines a divide-by-ratio, n, of the DATA input frequency to that of the CLOCK input frequency by counting a number of CLOCK cycles between successive DATA inputs. A bit value of the divide-by-ratio may be doubled to obtain the number of ½ CLOCK cycles between successive DATA inputs, i.e., 2n, and this doubled bit value may then be encoded to provide control bits to functional block 625, which replicates a full DATA cycle from a just completed evaluative cycle, as explained below.

The number of CLOCK cycles, n, for a full DATA period may be counted by a counter within DATA/CLOCK Ratio functional block 620. CLOCK Doubler 605, which produces clock pulses CLK×2 at double the frequency of CLOCK, may thus provide 2n CLK×2 clock pulses for a full DATA period to the high and low logic circuits of functional block 610 for counting of both high and low clock pulses during a full DATA period. Thus, for a full DATA period, the sum of the programmed duty cycle control bit values, corresponding to the high clock count of the active or high portion of the programmed duty cycle and the low clock count of the inactive or low portion of the programmed duty cycle, respectively, may also equal 2n.

Upon receiving a positive edge of DATA, a RESET may be generated that resets the programmed duty cycle control bit values in the bit comparator 615 to their initial states. In order that a first evaluative cycle may provide a minimum duty cycle, comprising but one incremental pulse width of ½ of a CLOCK cycle, a duty cycle control bit value to be matched to the high clock counter of functional block 610 is initially set to 1, while a duty cycle control bit value to be matched to the low clock counter of functional block 610 is initially set to 2n−1, i.e., 7 for the divide-by-4 setting shown in FIG. 7. If the high clock counter's bit value of 1 and the low clock counter's bit value of 7 do not, for example, match the programmed duty cycle control bits, then at the beginning of the second evaluative cycle, the bit value of the high clock counter may be incremented to a bit value of 2 and the bit value of the low clock counter may be decremented to a bit value of 6. Bit values of the high and low clock counters of functional block 610 may be stored for each evaluative cycle and may be compared to the programmed duty cycle control bits, stored in bit comparator 615, only after the last low clock pulse has been counted and before the beginning of the next evaluative cycle. To produce, for example, a 50% duty cycle of OUT from a programmable duty cycle selector that receives a DATA input from a divide-by-4 counter, as shown in FIG. 7, the programmed duty cycle control bits may correspond to a bit value of 4 for the high clock counter and a bit value of 4 for the low clock counter.

Referring to FIG. 6, the DATA/CLOCK Ratio Finder 620 may replicate a full DATA cycle, i.e., the period between two successive DATA inputs. Using CLK×2 as an input, DATA/CLOCK Ratio Finder 620 may count a number of clock pulses up to 2n using q bits, where n=$2^q$. On start-up, which is concurrent with the positive edge of the first DATA input, DATA/CLOCK Ratio Finder 620 may count the number of CLK×2 clock pulses until the next RESET arrives, i.e., the number of CLK×2 pulses for the total period of the programmed duty cycle. The q bits equaling the count of CLK×2 clock pulses may be stored, using switches, and a control bit value, m, may be encoded, such that m=n/2, which equals the divide-by-n setting.

Figure 9:
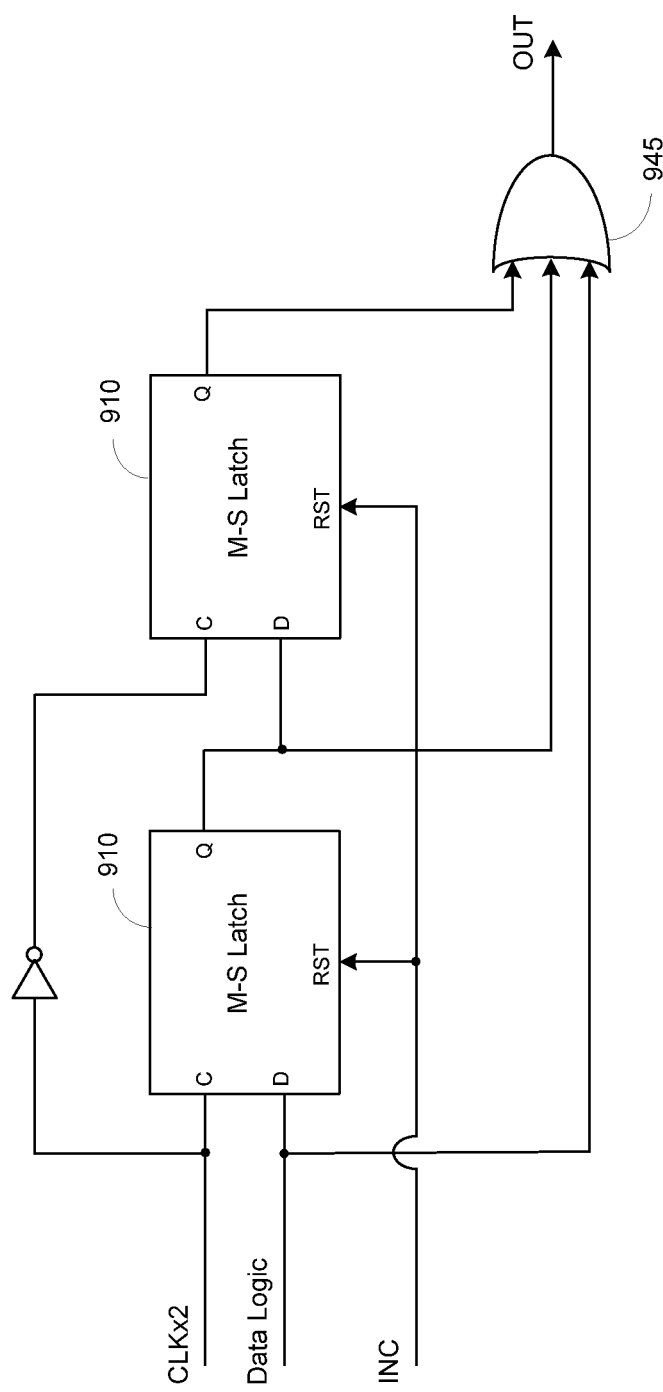
FIG. 9 illustrates a schematic of a portion of the functional block diagram 600, which provides shifting or non-shifting of prior just-completed evaluative cycles and pass through of a ½ CLOCK cycle at the beginning of a next evaluative cycle in an exemplary embodiment herein.

Also on start-up, the bit comparator 615 may be reset and may output a low, i.e., a logical 0, corresponding to a no increment signal. The INC signal, i.e., indicates that an increment is to be made to the duty cycle of a just-completed evaluative cycle; however, at start-up, there is no just-completed evaluative cycle. Thus, at start-up, functional bock 635, i.e., ½ CLOCK Shift or No Shift, does not shift an output of a prior evaluative cycle. Referring to FIG. 9, which illustrates an exemplary circuit of functional block 635, no shift of an output of a prior evaluative cycle may occur at start-up, because low inputs to resets of Master-Slave latches 910, from the logical 0 of INC, cause any input to ½ CLOCK Shift or No Shift 635 to pass through both Master-Slave latches 910, i.e., the latches are not operational.

On start-up, ½ CLOCK 640, which receives inputs from DATA and CLOCK may produce a ½ of a CLOCK cycle by, for example, inputting the positive edge of DATA into the set input of a set-reset flip-flop and the first negative edge of CLOCK into the reset input of the set-reset flip-flop. At start-up, this ½ of a CLOCK cycle passes through the OR gate of Data Logic 630 to the ½ CLOCK Shift or No Shift functional block 635.

Referring to FIG. 7, upon the next RESET following start-up, the duty cycle of OUT for the first evaluative cycle, i.e., ½ of a CLOCK cycle, may be used to gate the high and low clock counters of functional block 610 during the second evaluative cycle. During the second evaluative cycle, the high clock counter of functional block 610 may count one high clock pulse, caused by the feedback of the ½ of a CLOCK cycle from OUT, and the low clock counter may count 2n−1 low clock pulses, before the next reset. Assuming that the high and low clock counts do not correspond to the bit values of the programmed duty cycle control bits, INC may be set high, i.e., logical 1, by the bit comparator 615. With INC set high, the Master-Slave latches 910 become operative, and at the beginning of the second evaluative cycle, the duty cycle of OUT for the prior first evaluative cycle, i.e., ½ of a CLOCK cycle, is shifted by ½ of a CLOCK cycle by ½ CLOCK Shift or No Shift 635. The ½ of a CLOCK cycle, generated by ½ CLOCK 640, is transmitted through the Data Logic 630 and bypasses the Master-Slave latches 910 of the functional block, ½ CLOCK Shift or No Shift 635 to provide OUT at the OR gate 945. Thus, referring to the second evaluative cycle of FIG. 7, the ½ of a CLOCK cycle provided by ½ CLOCK 640 at the beginning of the evaluative cycle, i.e., the ½ CLOCK signal, and the ½ CLOCK cycle from the prior first evaluative cycle, which has been shifted by ½ of a CLOCK cycle, i.e., the Shifted Prior Duty Cycle Signal, produce a duty cycle of OUT for the second evaluative cycle that may equal two ½ CLOCK cycles, i.e., the OUT signal.

Review of FIG. 7 reveals that the leading edge of OUT for the second evaluative cycle corresponds to the leading edge of ½ CLOCK, which is not shifted, and that the trailing edge of OUT for the second evaluative cycle corresponds to the trailing edge of the shifted ½ of a CLOCK cycle. Similarly, as shown in FIG. 7, each successive evaluative cycle produces a duty cycle of OUT, whose leading edge corresponds to the leading edge of ½ CLOCK, which is not shifter, and a trailing edge the corresponds to the trailing edge of the ½ of a CLOCK cycle shifted prior duty cycle of OUT.

When the comparison of the high and low bit counts of the functional block 610 by the bit comparator 615 indicate that the value of the high and low bit counts matches the values of the programmed duty cycle control bits, INC may be set to a logical 0, which disables the Master-Slave latches 910 of functional block 635, i.e., ½ Shift or No Shift, allowing both ½ CLOCK and an un-shifted prior duty cycle of OUT from to pass through the Master-Slave latches 910 to the pulse accumulator 640. Referring to the last evaluative cycle of FIG. 7, logically ORing the ½ CLOCK and the un-shifted prior duty cycle of OUT from Full DATA cycle may provide a duty cycle of OUT that is unchanged from that of the prior duty cycle of OUT.

Figure 10:
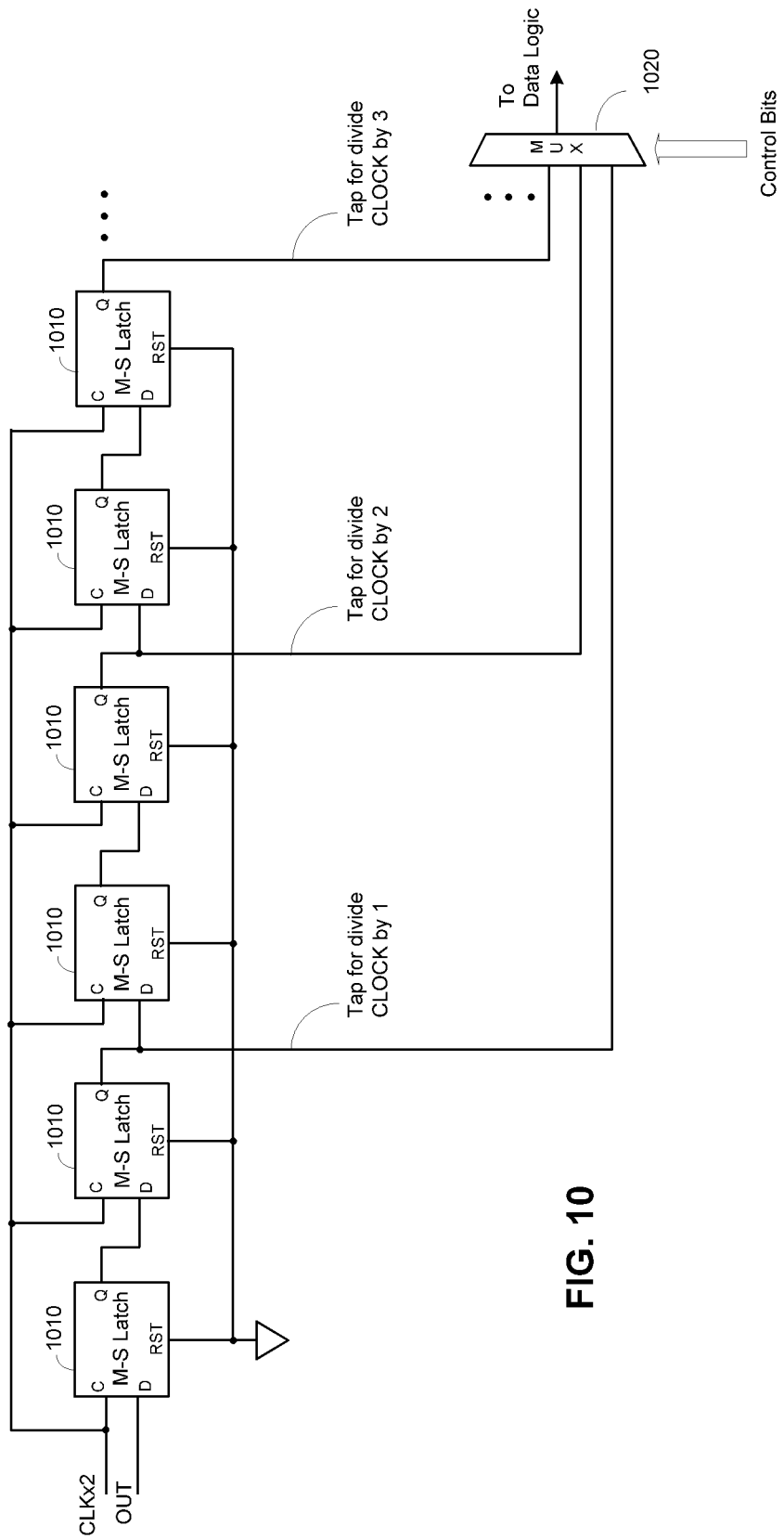
FIG. 10 illustrates a schematic of a portion of the functional block diagram of 600, in which a cascaded string of Master-Slave latches 1010 may provide evaluative cycles of all possible divide-by-n values, by tapping the outputs of pairs of Master-Slave latches corresponding to each successive divide-by-n setting in an exemplary embodiment herein.

The duty cycle of OUT, which has been shifted by ½ of a CLOCK cycle at the beginning of a non-start-up evaluative cycle, may not be fed directly back to the Master-Slave latches 910 of the functional block 635, ½ Shift or No Shift, because the feedback will result in the latches always shifting the inputted signal and there will be no trailing edge to the output of 635. The functional block of Full DATA Cycle 625 may provide an operative or high portion of the duty cycle OUT of a prior evaluative cycle, before the shifting of ½ of a CLOCK cycle occurs at the beginning of the next evaluative cycle, by toggling ½ CLOCK cycles for each replicated prior evaluative cycle according to the OUT signal being applied to the data input of a first Master-Slave latch 1010 in a cascaded string of Master-Slave latches 1010, as shown in FIG. 10. The cascaded string of Master-Slave latches 1010 may provide evaluative cycles of all possible divide-by-n values by tapping the outputs of pairs of Master-Slave latches by the multiplexer 1020, corresponding to each successive divide-by-n setting, as shown in FIG. 10. The correct DATA period, corresponding to the divide-by-n setting of DATA, may be obtained by a division of CLOCK frequency by DATA frequency, which is stored by the control bits generated by DATA/CLOCK Ratio Finder 620 and input to Full DATA Cycle 625. The operative or high portion of the duty cycle from the prior just-completed evaluative cycle, OUT, is available to Full DATA Cycle 625 before the beginning of the next evaluative cycle and thus, Full DATA Cycle 625 may provide an un-shifted prior just-completed evaluative cycle OUT to DATA Logic 630 and ½ CLOCK Shift or No Shift 635.

Figure 11:
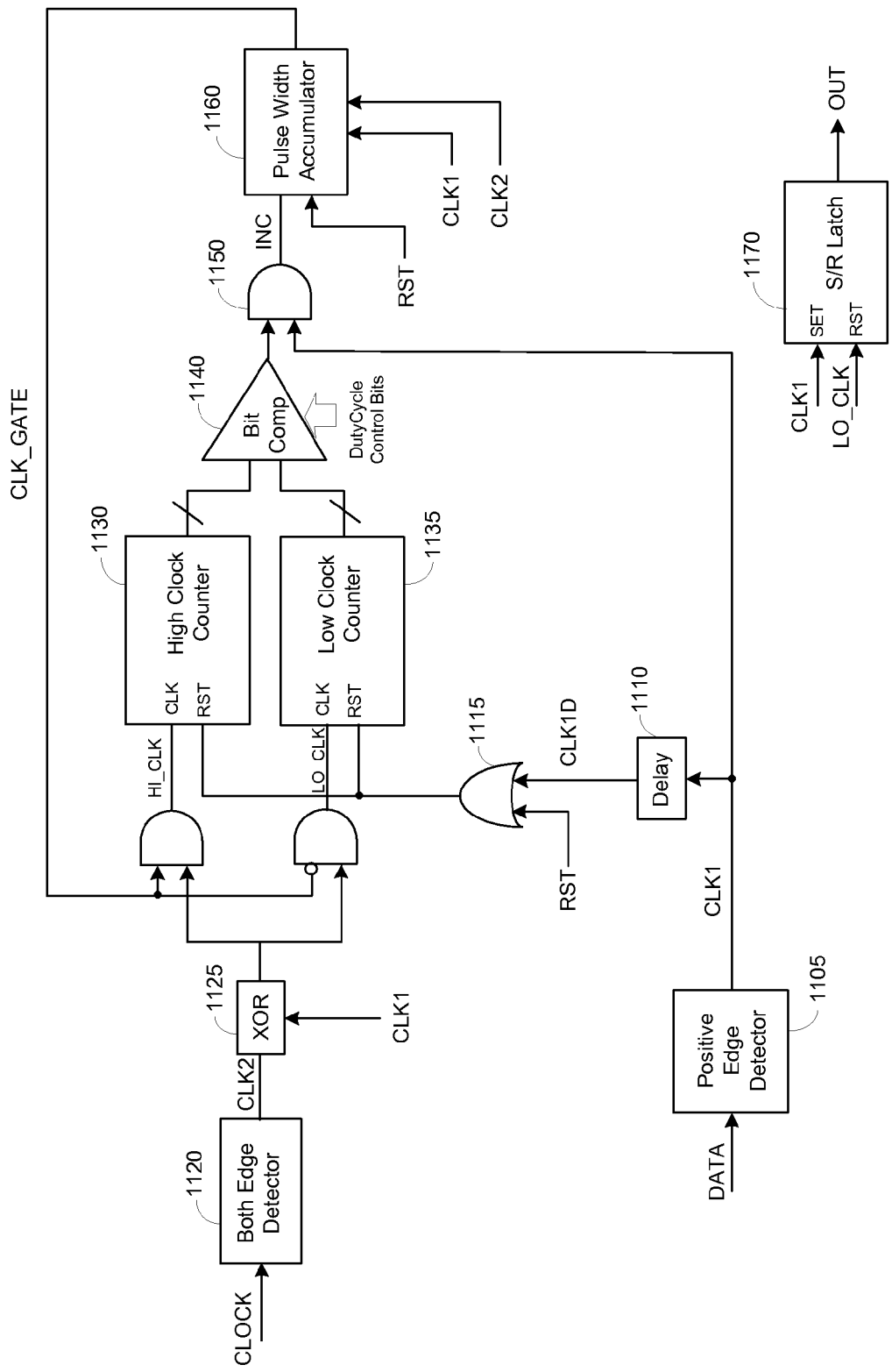
FIG. 11 illustrates a block diagram of a duty cycle selector that may use dual up/down counters included within a pulse width accumulator in an exemplary embodiment herein.
Figure 12:
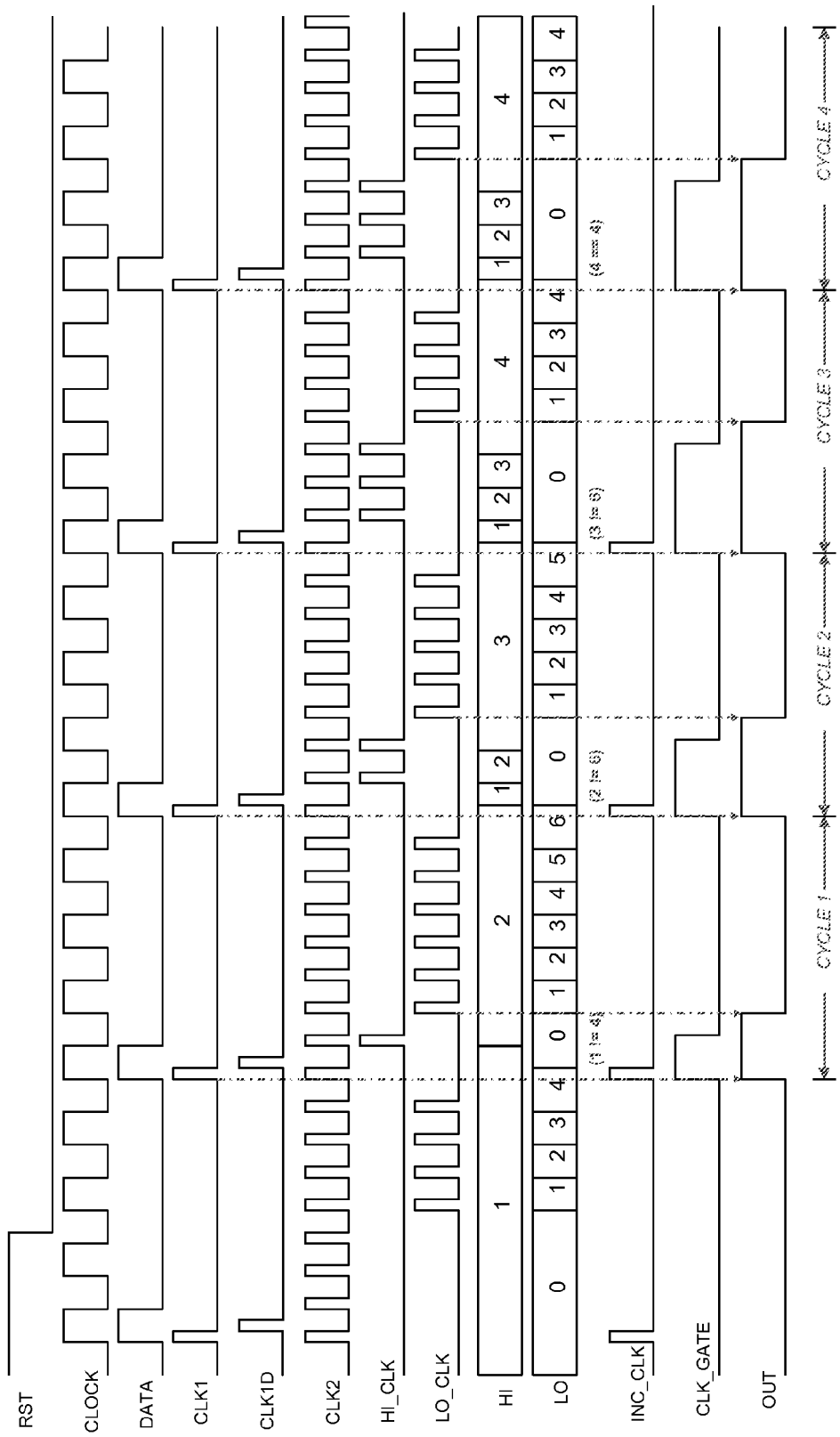
FIG. 12 illustrates a timing diagram associated with operation of the duty cycle selector shown in FIG. 11 in an exemplary embodiment herein.

Another exemplary embodiment herein may use a dual up-down counter method within a pulse width accumulator, as illustrated by the functional block diagram of FIG. 11 and the timing diagram for this method in FIG. 12. The functional block diagram of FIG. 11 may comprise: a positive edge detector 1105; a both edge detector 1120; a high clock counter 1130 and a low clock counter 1135; a bit comparator 1140; and a pulse width accumulator 1160.

The positive edge detector 1105 may generate a narrow clock pulse, i.e., CLK1, co-incident with every positive edge of the DATA input that marks the beginning of every evaluative cycle and is generated by the output of a divide-by-n counter, whose duty cycle varies with the divide-by-n setting of the counter. CLK1 may signal the incrementing of a pulse width by the pulse width accumulator 1160 at the beginning of every evaluative cycle. A delayed CLK1 signal, i.e., CLK1D, produced by delay 1110, is used to avoid counting a first clock pulse, while a fed back signal from pulse accumulator 1160 arrives at the logical gates for the counters. A reset may be provided to high and low clock counters 1130 and 1135 via gate 1115.

Referring to FIG. 12, the first clock pulse from both positive edge detector 1105, CLK1, and both edge detector 1120, CLK2 may be eliminated by an XOR gate for each evaluative cycle at the dashed lines at the beginning of each evaluative cycle. To compensate for the "missing" pulse, high clock counter 1130 may be set at the beginning of each evaluative cycle to a bit value of 1, while low clock counter 1135 may be set to a bit value of 0. Referring to FIG. 12, whenever CLK1 and CLK2 are co-incident, there is a "missing pulse" at the beginning of HI_CLK in each evaluative cycle.

The both edge detector 1120 may generate a narrow clock pulse, i.e., CLK2, corresponding to both the positive and negative edges of CLOCK, which has a 50% duty cycle and is input to the divide-by-n counter. CLK2 may provide clock pulses to be counted by the high and low clock counters 1130 and 1135, respectively, and may be used to provide a pulse width of ½ of a CLOCK cycle to the pulse width accumulator 1160.

Referring to FIG. 12, on start-up, RST may be high, causing the high and low clock counters 1130 and 1135, respectively, to clear, and the pulse width accumulator 1160 to be reset to a minimum pulse width. The output of the pulse width accumulator 1160, CLK_GATE, may be fed back to the high and low clock counters 1130 and 1135, respectively, through logical AND gates, which gate the high and low clock pulses to their respective clock counters, as is known in the art. During each evaluative cycle, high clock counter 1130 counts a number of clock pulses, while CLK_GATE is high. Similarly, low clock counter 1135 counts a number of clock pulses, while CLK_GATE is low.

FIG. 12 assumes that the functional block diagram illustrated by FIG. 11 receives a DATA input from a divide-by-4 counter, which receives a CLOCK timing signal, and that the programmed duty cycle control bits correspond to a 50% duty cycle, i.e., a bit value of 4 for the high clock count and an equal bit value of 4 for the low clock count. Referring to FIG. 12, at the beginning of the first evaluative cycle, i.e., Cycle 1, the bit values of the high and low clock counters 1130 and 1135, respectively, may be compared to the programmed duty cycle control bits stored in the bit comparator 1140. Since the bit values of the of the high and low clock counters 1130 and 1135, respectively, do not match the bit values of the programmed duty cycle control bits at the beginning of Cycle 1, bit comparator 1140 outputs a high, and an increment signal, i.e., INC, may be output by gate 1150, only while CLK1 is high at gate 1150. The INC signal may then cause pulse width accumulator 1160 to increment CLK_GATE by ½ of a CLOCK cycle. The incremented CLK_GATE, output by pulse width accumulator 1160, may then be fed back to the high and low time clock counter 1130 and 1135, respectively, via the logical AND gates for the next evaluative cycle.

To avoid timing problems at the point where a current evaluative cycle ends and the next evaluative cycle begins, an ordered sequence of sequence of events may take place at the beginning of every evaluative cycle:

1) bit values of high and low clock counters 1130, 1135, are compared to the programmed duty cycle control bits;
2) INC is pulsed, while CLK1 is high, if high and low clock counters 1130, 1135, do match the programmed duty cycle control bits;
3) CLK_GATE is incremented by ½ of a CLOCK cycle, if INC is pulsed; and
4) high and low clock counters 1130, 1135, are reset.

To provide the time necessary to accomplish the ordered sequence of events, listed above, the first clock pulse of CLK1 and CLK2 may be eliminated by the block XOR 1125. The first clock pulse of each evaluative cycle may safely be ignored, because we may assume that CLK_GATE will be high for at least ½ of a CLOCK cycle, i.e., on start-up, CLK_GATE is set to a minimum width of ½ of a CLOCK cycle.

Referring to FIG. 11, output of the duty cycle selector of an exemplary embodiment herein is shown as OUT, and may be generated by set-reset (S/R) latch 1170. The set input to S/R latch 1170 may be connected to CLK1 and the reset input to LO_CLK. The propagation path delay from the positive edge of the input DATA to the set pin of S/R latch 1170, i.e., onset of the operative or high portion of the duty cycle, may equal the propagation path delay from the positive edge of the first low clock pulse from LO_CLK to the reset pin of S/R latch 1170, i.e., onset of the inoperative or low portion of the duty cycle as indicated by the dashed lines, to ensure proper timing of each evaluative cycle.

Figure 13:
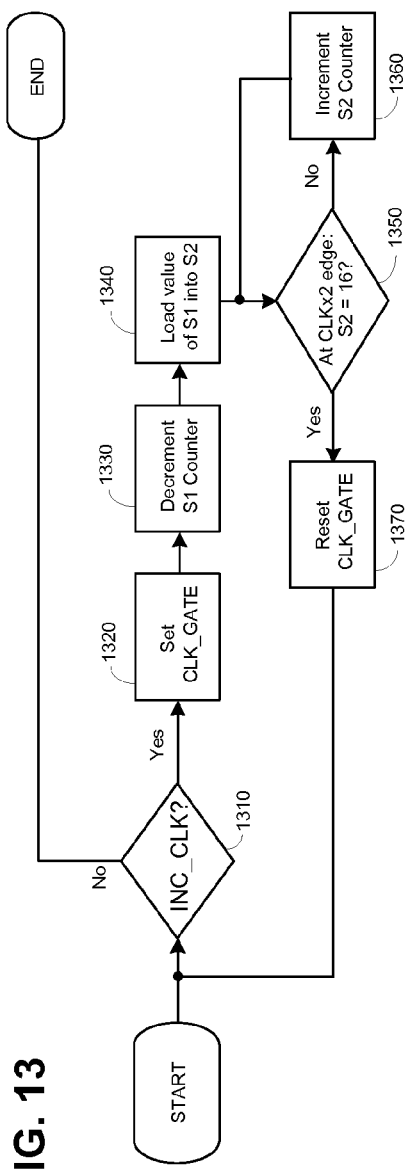
FIG. 13 illustrates a flowchart of a method of incrementing the output of pulse width accumulator 1160, i.e., CLK_GATE, by using up/down counters in an exemplary embodiment herein.
Figure 14:
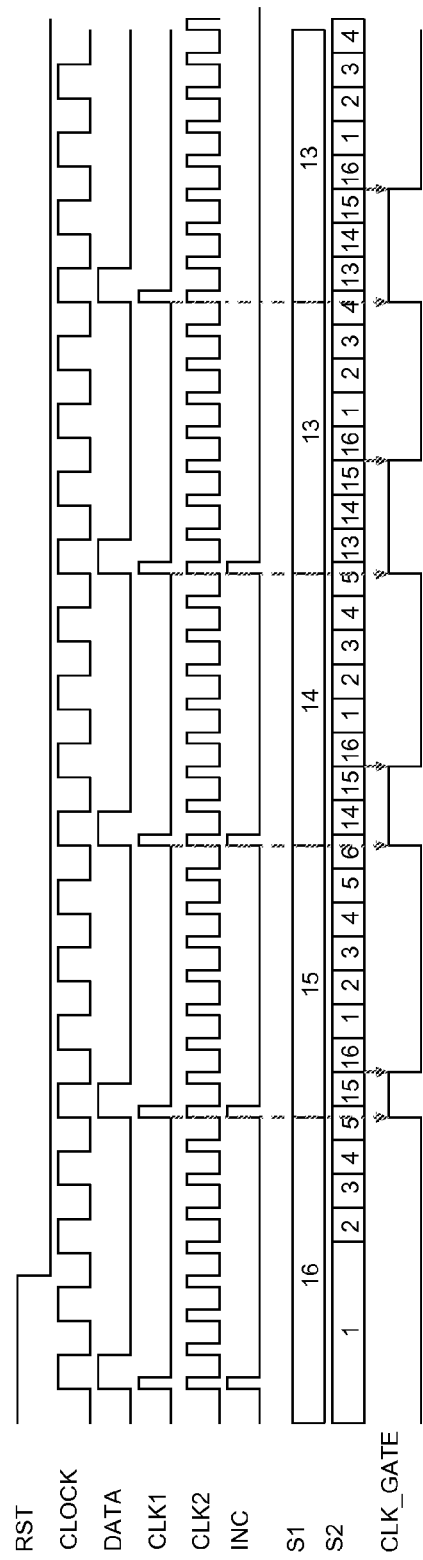
FIG. 14 illustrates a timing diagram associated with the method of incrementing pulse width accumulator 1160, i.e., CLK_GATE, by using up/down ring counters in an exemplary embodiment herein.
Figure 15:
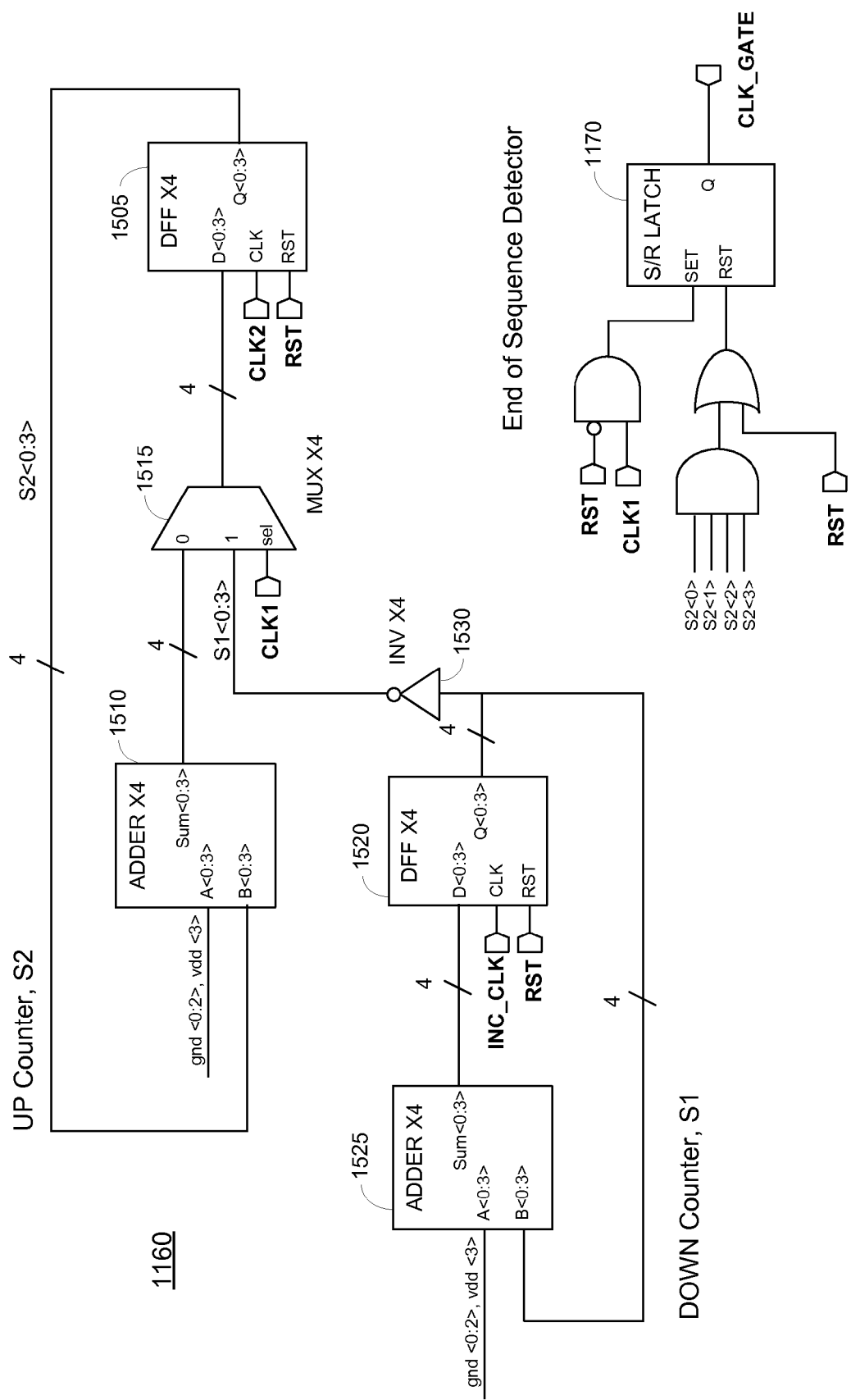
FIG. 15 illustrates a schematic of the pulse width accumulator 1160 and gating circuitry associated with S/R latch 1170 in an exemplary embodiment herein.

FIG. 13 illustrates a flowchart of a method of incrementing the output of pulse width accumulator 1160, i.e., CLK_GATE, by using up/down ring counters in pulse width accumulator 1160, while FIG. 14 illustrates a timing diagram associated with the method of incrementing CLK_GATE by using up/down ring counters in pulse width accumulator 1160. FIG. 15 illustrates a functional block diagram of the pulse width accumulator 1160 for an exemplary embodiment herein. In FIGS. 14 and 15, it may be assumed that each of the up/down ring counters of an exemplary embodiment herein counts a bit value of 16 states, i.e., 4 bits; each up/down ring counter, however, may count greater bit values by increasing the number of bit as is well known in the art.

Referring to FIG. 13, the pulse width accumulator 1160 may iteratively increment the width of the fed back CLK_GATE signal when an increment signal, INC, is received in 1310 of the flowchart. As explained above, INC may only occur while CLK1 is high. On start-up, RST is high, which may initialize down ring counter, S1, of pulse width accumulator 1160 to, for example, a bit value corresponding to 16, i.e., the total number of positive and negative edges of a full evaluative cycle, while up ring counter, S2, of pulse width accumulator 1160 may be initialized to a bit value corresponding to 1, i.e., the minimum width of CLK_GATE 1320.

Following reset, down ring counter, S1, may be decremented on the positive edge of every INC_CLK in 1330 of the flowchart, as indicated by the dashed lines in the timing diagram of FIG. 14; while up ring counter, S2, may be incremented on every negative edge of CLK2. When CLK1 goes high, the content of down ring counter S1 may be made available to up ring counter S2 by a multiplexer, and the bit value of down ring counter S1 may be loaded into up ring counter S2 with the next negative edge of CLK2 in 1340 of the flowchart. For example, when CLK1 goes high, following reset going low, the bit value of down ring counter S1, i.e., a bit value corresponding to 15, may be available to up ring counter S2 and may then be loaded into up ring counter S2, upon the next negative edge of CLK2. The method may determine, if a bit value, corresponding to 16, has been loaded into up ring counter S2 in 1350 of the flowchart. If up ring counter S2 does not contain a bit value of 16, then up ring counter S2 is again incremented by the next negative edge of CLK2 in 1360 of the flowchart, and the result is fed back to 1350 to determine if the now incremented value corresponds to 16. If up ring counter S2 does contain a bit value, corresponding to 16, then CLK_GATE is caused to go low for the current evaluative cycle in 1370 of the flowchart.

The positive edge of CLK_GATE, i.e., the output of pulse width accumulator 1160 of FIG. 11, may be caused by the positive edge of CLK1, while the negative edge of CLK_GATE may be caused by detection of a bit value, corresponding to 16, within up ring counter, S2. A simple set/reset (S/R) latch 1170 may generate CLK_GATE, when the positive edge of CLK1 is input to the set pin of the S/R latch 1170, and a detection pulse, indicating that a bit value corresponding to 16 is detected in up ring counter S2 by, for example, NAND gates, is input to the reset pin of the S/R latch 1170.

Referring to FIGS. 11 and 14, the width of CLK_GATE may continue to be incremented, until INC, from gate 1150, stops pulsing, as illustrated by the last evaluative cycle of FIG. 14. When INC stops pulsing, down ring counter S1 will stop decrementing, and up ring counter S2 will reload the same bit value stored in down ring counter S1 at the beginning of each evaluative cycle.

FIG. 15 illustrates a functional block diagram of pulse width accumulator 1160 that may include: down ring counter, S1; and up ring counter, S2. FIG. 15 depicts a single instance of arrayed x4 instances, as indicated by X4 in the figure, of the components of the up/down ring counters in this exemplary embodiment herein. The up ring counter, S2 may receive CLK2 at the clock input of negative edge-triggered D flip-flop (DFF) 1505. The output of DFF 1505 may be fed back to the B input of adder 1510, while the A input of adder 1510 may provide an incremental bit value. The incremented bit value of up ring counter, S1, may then be output to multiplexer 1515.

The down ring counter, S1, may receive INC_CLK at the clock input of positive edge-trigged DFF 1520. The output of DFF 1520 may be fed back to the B input of adder 1525, while the A input of adder 1525 may provide an incremented bit value. The output of DFF 1520 may be logically inverted by inverter 1530 and the resulting "decremented" bit value may be transmitted to multiplexer 1515. When CLK1 goes high, the "decremented" bit value of down ring counter, S2, may be loaded into the data inputs of the DFF 1505 of up ring counter, S1.

An end of sequence detector may include set-reset (SR) latch 1170, which receives CLK1 at its set input via a logical gate to provide the positive edge of CLK_GATE, and a signal from the logical ANDing of bits S2<0:3> of the up ring counter, S2, indicating detection of a maximal bit value of 16, at its reset input to provide the negative edge of CLK_GATE.

The pulse width accumulator 1160 may grow the pulse width of CLK_GATE by increments of ½ of a CLOCK cycle in accordance with the method of FIG. 13, until, for example, a programmed duty cycle of 50% is attained. The pulse width accumulator 1160 comprises: a down ring counter further comprising q bits, where q is greater than or equal to $\log_2 (2n-1)$; an up ring counter also further comprising q bits, where q is greater than or equal to $\log_2 (2n-1)$; and an end of sequence detector that may detect a selected bit value, corresponding to a selected CLK_GATE pulse width, in the up ring counter by, for example, NAND gates.

In one exemplary embodiment, a Kogge-Stone adder may be used to form the up/down ring counters of the pulse width accumulator 1160 because these types of counters provide the benefits of: synchronicity; speed; and programmability.

What is claimed is:

1. A device for generating a waveform according to a programmable duty cycle from a frequency reference signal that may be divided, said device comprising:
   a timing circuit that inputs a CLOCK signal having a 50% duty cycle to a divider, whose output varies over a plurality of divide-by-n settings; and
   a waveform generator further comprising:
      a frequency doubler that outputs clock pluses that are double a frequency of said CLOCK signal;
      a ½ CLOCK pulse generator that produces one ½ of a CLOCK cycle from said output of said divider and an output of said doubler at said beginning of every evaluative cycle;
      high and low clock pulse counters that generate high and low clock pulses, which are said double frequency of said CLOCK signal during a current evaluative cycle, said high and low pulses being gated by high and low portions of a fed back output of said waveform generator, OUT, corresponding to a duty cycle for said current evaluative cycle;
      a bit comparator that compares high and low clock bit counts from said high and low clock pulses, and if said duty cycle for said current evaluative cycle is less than a bit value of said programmed duty cycle, then outputs an increment signal, INC, after a last low clock pulse is counted for said current evaluative cycle and before a beginning of a next evaluative cycle;
      a ½ CLOCK shifter that shifts a duty cycle of OUT from said current evaluative cycle by ½ of a CLOCK cycle, upon receiving said INC signal and before said beginning of said next evaluative cycle; and a pulse width accumulator that receives said one ½ of a CLOCK cycle and said shifted duty cycle of OUT for said current evaluative cycle, and forms a pulse width of a waveform of said duty cycle of OUT, which is incremented ½ of a CLOCK cycle relative to a beginning of said duty cycle of OUT for said current evaluative cycle, at said beginning of said next evaluative cycle.

2. The device of claim 1, further comprising a one-shot that receives an output from said divider, said one-shot outputting a RESET pulse that resets said high and low clock pulse counters, and said bit comparator at said beginning of every evaluative cycle.

3. The device of claim 1, further comprising matched delay elements at gates to inputs of said high and low clock pulse counters and to said high and low portions of said output of said waveform generator, OUT, corresponding to a duty cycle for said current evaluative cycle.

4. The device of claim 1, wherein said pulse width accumulator comprises an OR gate receiving as inputs said one ½ of a CLOCK cycle and an output from said ½ shifter that shifts a duty cycle of OUT from said current evaluative cycle by ½ of a CLOCK cycle, upon receiving said INC signal.

5. The device of claim 1, further comprising programmed duty cycle control bits that include bit values from a range of ½n to (2n−1)/2n, where n represents a maximal divide-by-n setting for said divider of said timing circuit.

6. The device of claim 1, wherein said ½ CLOCK shifter further comprises two Master-SLAVE latches that are cascaded, such that a low INC signal resets said two Master-Slave latches, allowing said one ½ of a CLOCK cycle to pass through said ½ CLOCK shifter to said pulse width accumulator at start-up.

7. A method of generating a waveform according to a programmable duty cycle from a frequency reference signal that is divided, said method comprising:

inputting a CLOCK signal having a 50% duty cycle to a divider, whose output varies over a plurality of divide-by-n settings; and generating a waveform corresponding to a duty cycle of an output, OUT, said generating further comprising:

receiving clock pulses that are double a frequency of said CLOCK signal;

generating one ½ of a CLOCK cycle from said output of said divider and an output of said doubled CLOCK frequency at a beginning of an evaluative cycle initiated by an output pulse from said divider;

generating high and low clock pulse counts from high and low clock pulses, which are said double of said frequency of said CLOCK signal during a current evaluative cycle, and gating said high and low clock pulses by high and low portions of a fed back output of said waveform generator, OUT, corresponding to a duty cycle for said current evaluative cycle;

comparing high and low clock bit counts from said high and low clock pulses, and if said duty cycle for said current evaluative cycle is less than a bit value of said programmed duty cycle, then outputting an increment pulse width signal, INC, after a last low clock pulse is counted for said current evaluative cycle and before a beginning of a next evaluative cycle;

shifting, by one ½ of a CLOCK cycle, a duty cycle of OUT from said current evaluative cycle, upon receiving said INC signal and before said beginning of said next evaluative cycle; and receiving, by a pulse width accumulator, said one ½ of a CLOCK cycle and said shifted duty cycle of OUT for said current evaluative cycle, and forming a pulse width of a waveform of said duty cycle of OUT, which is incremented ½ of a CLOCK cycle relative to a beginning of said duty cycle of OUT for said current evaluative cycle, at said beginning of said next evaluative cycle.

8. The method of claim 7, further comprising outputting a RESET pulse upon receiving an output from said divider, said RESET pulse resetting said high and low clock pulse counters and said bit comparator at said beginning of every evaluative cycle.

9. The method of claim 7, further comprising matched delaying of inputted clock pulses to said high and low clock pulse counters and of said high and low portions of said output of said waveform generator, OUT, corresponding to a duty cycle for said current evaluative cycle.

10. The method of claim 7, further comprising ORing, by the pulse width accumulator inputs of said one ½ of a CLOCK cycle and an output of said ½ shifter that shifts a duty cycle of OUT from said current evaluative cycle by ½ of a CLOCK cycle, upon receiving said INC signal.

11. The method of claim 7, further comprising inputting programmed duty cycle control bits that include bit values from a range of ½n to (2n−1)/2n, where n represents a maximal divide-by-n setting for said divider of said timing circuit.

12. The method of claim 7, wherein a low INC signal resets two Master-Slave latches of said ½ CLOCK shifter, allowing said one ½ of a CLOCK cycle to pass through said ½ CLOCK shifter to said pulse width accumulator at start-up.

* * * * *